(12) United States Patent
Lee et al.

(10) Patent No.: US 6,471,462 B1
(45) Date of Patent: Oct. 29, 2002

(54) CARRIER HANDLING APPARATUS OF AN IC MODULE HANDLER

(75) Inventors: Sang Soo Lee; Wan Gu Lee, both of Choongchungnam-do; Jong Won Kim, Kyungki-do; Hee Soo Kim, Kyungki-do; Young Hak Oh, Kyungki-do; Dong Chun Lee, Seoul, all of (KR)

(73) Assignee: Mirae Corporation, Choongchungnam-do (KR)

( * ) Notice: Subject to any disclaimer, the term of this patent is extended or adjusted under 35 U.S.C. 154(b) by 0 days.

(21) Appl. No.: 09/449,573

(22) Filed: Nov. 29, 1999

(30) Foreign Application Priority Data

Nov. 28, 1998 (KR) .............................. 98-51506
Nov. 28, 1998 (KR) .............................. 98-51507

(51) Int. Cl.[7] .............................................. G01R 31/26
(52) U.S. Cl. ..................................... 414/416; 198/463.1
(58) Field of Search ........................... 414/416, 222.01, 414/222.04, 222.05, 222.06, 222.07, 225.01, 226.02, 226.04, 753.1, 940; 198/345.1, 347.3, 346.1, 346.2, 463.1, 463.2, 468.01, 468.2, 597, 717, 736, 747

(56) References Cited

U.S. PATENT DOCUMENTS 5,813,817 A * 9/1998 Matsumiya et al. . 414/753.1 X
6,071,060 A * 6/2000 Campbell et al. ........... 414/416

* cited by examiner

Primary Examiner—Robert P. Olszewski
Assistant Examiner—Gerald J. O'Connor
(74) Attorney, Agent, or Firm—Fleshner & Kim, LLP (57) ABSTRACT

A carrier handling apparatus of an IC module handler includes a carrier transferring unit for holding one side of the carrier to transfer the same between the various processes, and a carrier positioning unit for precisely positioning the carrier. The carrier handling apparatus includes a carrier for transferring predetermined modules, a carrier transferring unit for transferring the carrier from a loading location to an unloading location, and a carrier positioning unit for precisely positioning the carrier in the loading and unloading locations, thereby allowing IC modules contained in a tray to be accurately loaded into the carrier or unloaded therefrom by a pick-up means. According to another aspect of the present invention, a slider is installed to be moved along the traveling path of the carrier, and is provided with a pair of fingers that can be withdrawn or spread by one cylinder, so that the area required to install the carrier transferring apparatus can be minimized. Further, since the carrier is accurately positioned before the pick-up means loads and unloads the IC modules in the loading and unloading locations, any troubles which may be caused due to position inaccuracies during the loading and unloading of the IC modules can be prevented in advance, thereby maximizing the operation rate of the apparatus.

14 Claims, 12 Drawing Sheets

CARRIER HANDLING APPARATUS OF AN IC MODULE HANDLER

BACKGROUND OF THE INVENTION

1. Field of the Invention

The present invention relates to an IC (Integrated Circuit) module handler operated to test IC modules while a carrier containing the IC modules therein is transferred between loading, testing and unloading processes, and more particularly to a carrier handling apparatus of an IC module handler, including a carrier transferring unit that holds one side of the carrier as it is transferred between processes, and a carrier positioning unit for precisely positioning the carrier in a loading or unloading location.

2. Background of the Related Art

Typically, an IC module refers to a structure provided with a substrate whose one side or both sides thereof are used for fixedly mounting a plurality of ICs and electric components, for example, by soldering, and have the capability of extending a capacity when it is coupled to a mother substrate.

In the prior art, there has been no apparatus for automatically loading IC modules as final products into a test socket, testing same, classifying same into respective categories depending upon the test results, and then unloading the classified modules into the customer trays (not shown).

For this reason, to test the final product, an IC module, the operator manually has to pick up an IC module from the test tray in which the IC modules are contained, load it into a test socket, conduct tests for a preset time period, and finally classify the IC module, depending upon the test result, in order to put it into the customer tray (passed test), or into a "reject" tray. This results in lower productivity due to the required manual work.

Further, such tedious, repetitive. manual work contributes to lower productivity.

When an IC module handler is operated to hold the IC modules in a tray and to use a pick-up means to directly load and unload the held IC modules into a test socket located at a test site, the carrier is not directly used in these processes. Therefore, at the loading and unloading locations, a unit for determining the position of the carrier would not be required.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Therefore, it is an object of the present invention to provide an IC module handling apparatus capable of automatically transferring a carrier between the various processes in a minimal space using a carrier to enhance the operation rate of an expensive apparatus.

Another object of the present invention is to provide an IC module handling apparatus of an IC module handler which enables accurate loading and unloading of IC modules contained in a tray into the carrier by accurately determining the position of the carrier in the loading and unloading locations.

These objects and advantages are accomplished by the present invention by providing a carrier handling apparatus for an IC module handler, the apparatus comprising: a carrier for holding IC modules; a carrier transferring unit for transferring the carrier from a loading location to an unloading location; and a carrier positioning unit for precisely positioning the carrier in loading and unloading locations, thereby allowing the IC modules contained in a tray to be accurately loaded into the carrier or unloaded therefrom by a pick-up means.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 9a is a sectional view taken along line A—A in FIG. 8a.

DETAILED DESCRIPTION OF PREFERRED EMBODIMENTS

A carrier handling apparatus of an IC module handler according to the present invention will be described in detail, with reference to the accompanying drawings.

Figure 1:
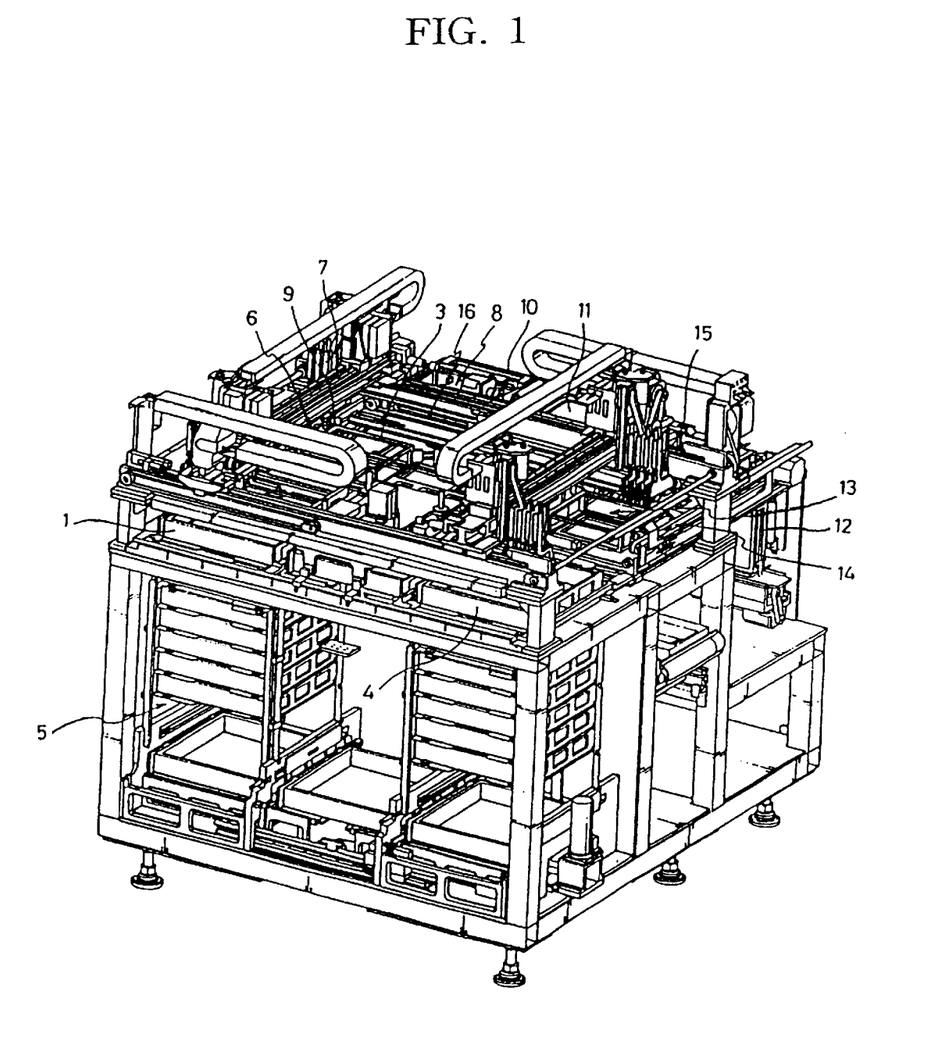
FIG. 1 is a perspective view of an IC module handler to which the present invention is applied.
Figure 2:
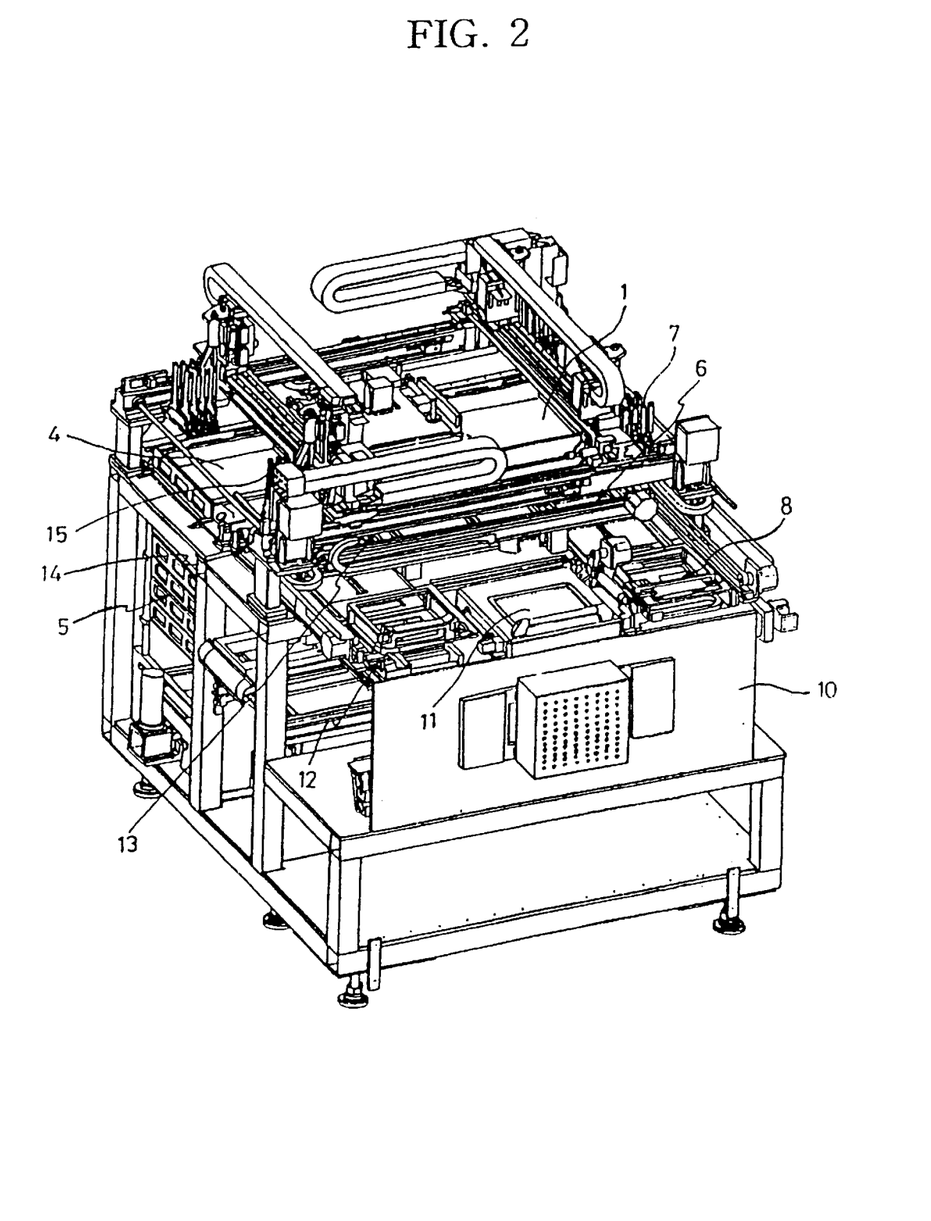
FIG. 2 is a rear side perspective view of the handler shown in FIG. 1.

According to the present invention, as shown in FIGS. 1 and 2, a carrier handling apparatus of an IC module handler includes: an elevation unit 5, a loading side pick-up means 7, a first transferring means 9, a loading side rotator 8, a heating chamber 10, a test site 11, an unloading side rotator 12, a second transferring means 14, an unloading side pickup means 15, a third transferring means 16, etc.

Elevation unit 5 is operated to sequentially elevate a stack plate used for placing a tray 1 thereon in one step when an IC module contained in tray 1 is loaded into a carrier 3, or to sequentially lower the stack plate by one step once tested and classified IC modules ha e been unloaded into a customer tray 4.

Loading side pick-up means 7 is used for sequentially holding IC modules contained in tray 1 and then loading the IC modules into carrier 3, when it is located in loading location 6.

First transferring means 9 is used for transferring carrier 3 to loading side rotator 8 once the carrier has received all of the IC modules to be tested.

Loading side rotator 8 is operated to rotate carrier 3 by 90-degrees when the carrier 3 arrives thereat by first transferring means 9.

Heating chamber 10 is disposed below loading side rotator 8, and is used for heating IC modules to a temperature suitable for testing once the carriers have been sequentially transferred thereto by loading side rotator 8.

Test site 11, disposed at one side of heating chamber 10, receives an IC module once it has been heated to a temperature suitable for testing. The carrier is then pushed toward:a test socket, and tests for the IC modules are performed for a preset time period.

Unloading side rotator 12 is operated to rotate carrier 3 by 90-degrees when the carrier arrives thereat with tested IC modules.

Second transferring means 14 is used for horizontally transferring carrier 3 from unloading side rotator 12 to unloading location 13.

Unloading side pick-up means 15 is used for selectively holding IC modules transferred thereto by second transferring means 14, based upon test results, and for then unloading the IC modules into customer tray 4.

Third transferring means 16 is used for horizontally transferring an empty carrier 3 to loading location 6.

Since the IC module handler thus constructed uses carriers 3, it is required to have first, second and third transferring means 9, 14, 16 for transfer between the various processes without interfering with the other parts of the overall process.

Figure 3:
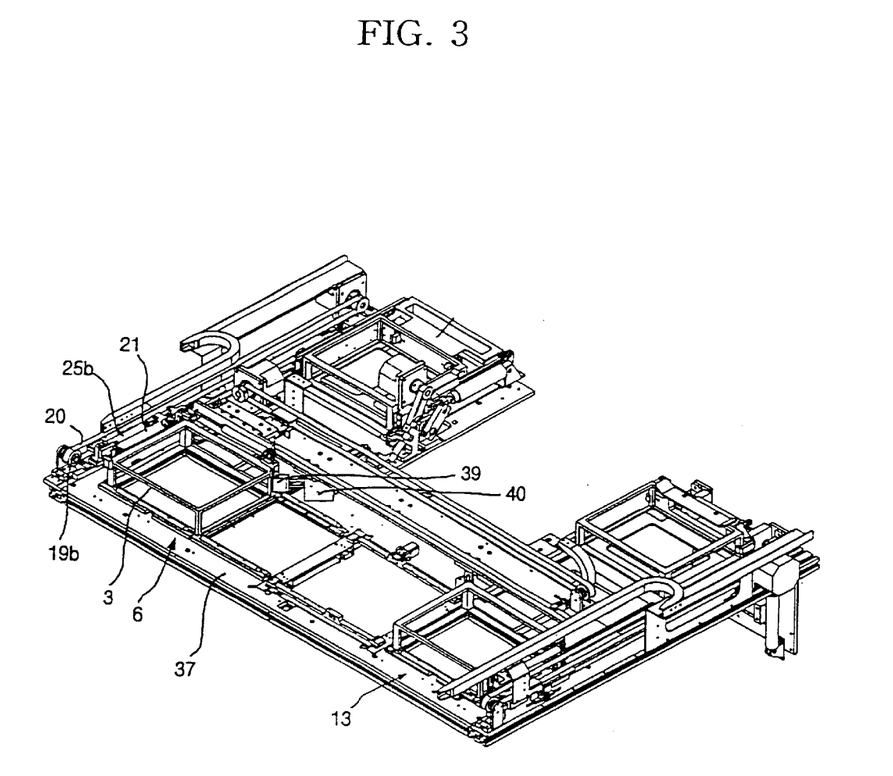
FIG. 3 is a perspective. view showing a carrier handling apparatus of an IC module handler according to the present invention.

As shown in FIG. 3, the carrier handling apparatus of the IC module handler according to the present invention comprises: a carrier 3; a carrier transferring unit (See FIG. 4) for transferring carrier 3 from the unloading location to the loading location; and a carrier positioning unit (see FIG. 7), which precisely positions carrier 3 in the loading and unloading locations, thus permitting IC modules in a tray to be accurately loaded into the carrier 3 or unloaded therefrom by a pick-up means.

As shown in FIGS. 4 to 6a and 6b, the carrier transferring unit, one of the main elements of the present invention, is provided with an LM guider 17 disposed in the same direction as the traveling direction of the carrier within the transferring unit, and a pair of pulleys 19a, 19b installed to span the length of the LM guider 17, configured to be rotated by a motor 18, and over which a timing belt 20 is looped.

Figure 4:
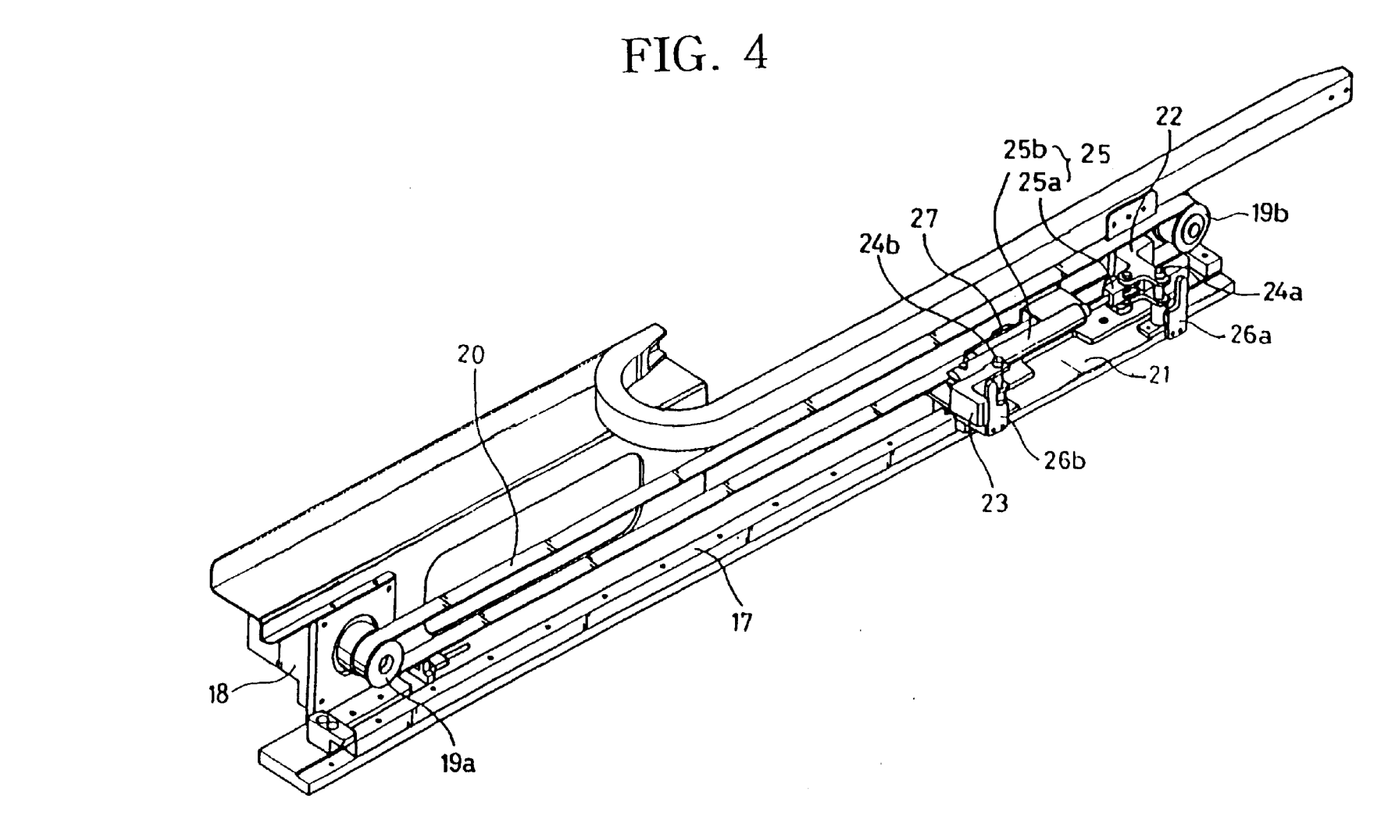
FIG. 4 is a perspective view of a carrier transferring unit as one of the main parts of the present invention.
Figure 5:
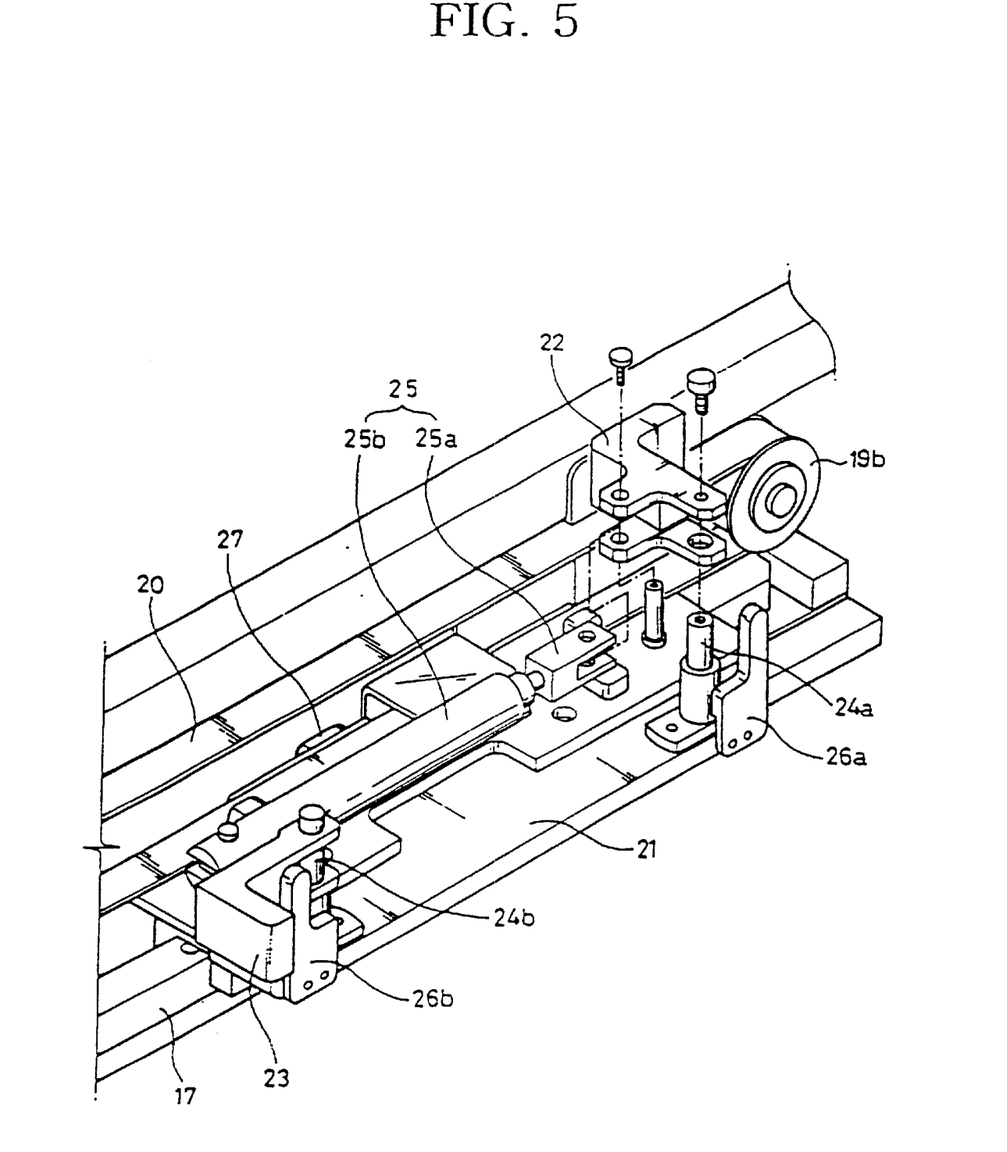
FIG. 5 is an exploded perspective view of a portion of the carrier transferring unit show in FIG. 4.

One end of the slider 21, which is guided by the LM guider 17 and a second end is fixedly coupled to timing belt 20, whereby slider 21 moves along the LM guider 17 when timing belt 20 is driven by motor 18. Further, both ends of slider 21 are, respectively, provided with fingers 22, 23, the fingers 22, 23 having the function of holding side surfaces of carrier 3, and each finger pivoting on a respective axis 24a, 24b. One end of finger 23 is hingedly coupled to a cylinder body 25b, and one end of finger 22 is hingedly coupled to a rod 25a. Thereby, the fingers 22, 23 are opened or closed by operation of cylinder 25.

Slider 21 also has one side surface provided with a pair of stoppers 26a, 26b used for controlling the fingers' rotational operation with respect to respective axes 24a, 24b. Movement of slider 21 is controlled by driving of motor 18, and is based upon sensing of a sensor plate 27 that is fixed to the slider and with a sensor (not shown) that is disposed within a stroke range of the slider.

Operation of the carrier transferring unit, one of the main parts of the present invention, will now be explained with reference to FIGS. 4 and 6b.

In a state in which IC modules to be tested have been loaded into carrier 3, located in loading location 6, the following example will be considered, which relates to first transferring means 9 for transferring a carrier to loading side rotator 8.

Figure 6A:
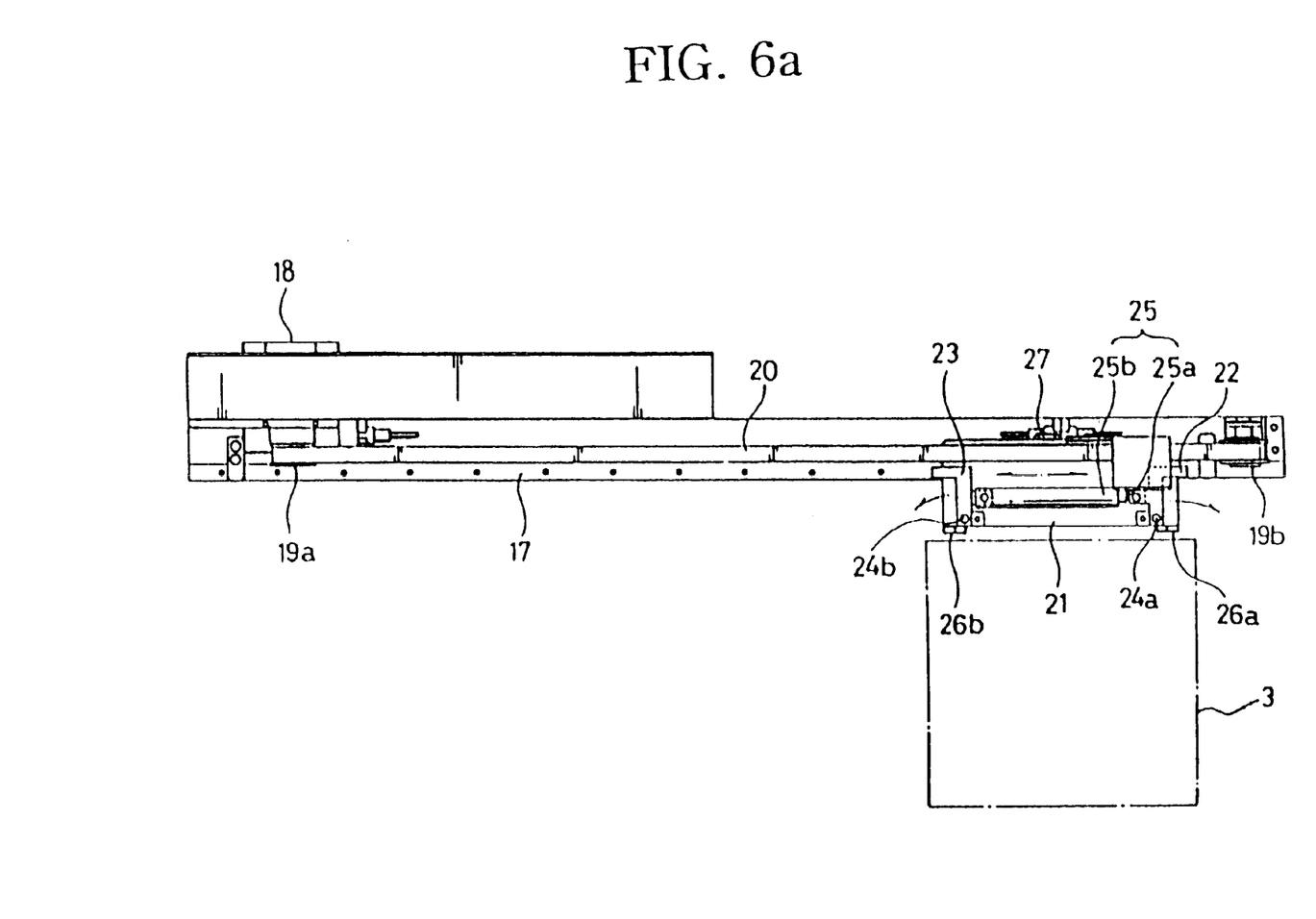
FIG. 6a shows a released holding state for a carrier.
Figure 6B:
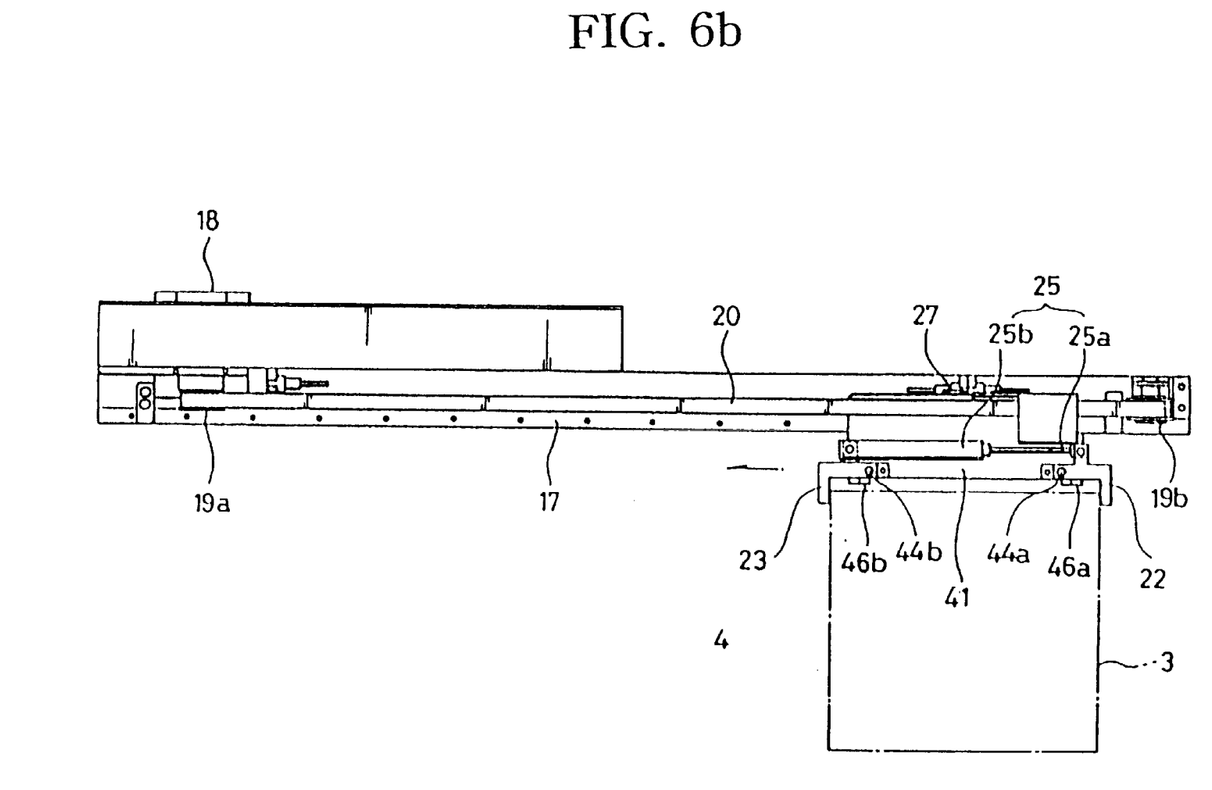
FIG. 6b shows an active holding state in which fingers hold the carrier.

As shown in FIG. 6a, under an opened fingers (22, 23) condition, the motor 18 drives pulley 19a until slider 21 reaches loading location 6. Therefore, slider 21, whose one end is fixed to timing belt 20, is guided along LM guider 17 and swiftly moves to loading location 6. Control of driving of motor 18 is possible due to sensing of a sensor plate 27 that is fixed to the slider, and to a sensor (not shown) disposed within a stroke range of the slider.

Under such a condition, after carrier 3 is moved to loading location 6 by third transferring means 16, and loading side pick-up means 7 loads IC modules to be tested into carrier 3, cylinder 25 is driven to effect revolutional movement of fingers 22, 23. By the cylinder's operation, fingers 22, 23 are rotated inwardly toward each other to hold respective side surfaces of carrier 3, as will be described in detail below.

Once slider 21 has been moved to loading location 6, gas cylinder 25 is operated to extend retracted rod 25b, and finger 22, hingedly coupled to rod 25a, pivots on axis 24a to thereby hold one side of carrier 3.

Once finger 22 has contacted and held one side of carrier 3, continued driving of cylinder 25 further extends rod 25a by using finger 22 as a supporting point therefore. Asia result, finger 23, hingedly coupled about axis 24b, and connected to cylinder body 25b, is rotated to hold the opposite side of carrier 3.

As described above, in operation, the revolution of fingers 22, 23 is controlled by fixed stoppers 26a, 26b, respectively, which are located on one side surface of the slider 21.

In a state in which the two fingers 22, 23 are rotated inwardly toward each other to hold opposing side surfaces of carrier 3, motor 18 is re-driven to rotate the pulley 19a in an opposite direction to the direction mentioned above to appropriately move timing belt 20. Therefore, slider 21, having one end fixed to timing belt 20, is horizontally moved along LM guider 17, thereby moving carrier 3, whose opposing side surfaces are held by fingers 22, 23 to loading side rotator 8.

After transfer of carrier 3 has been completed, extended rod 25a is retracted, which causes fingers 22, 23 to spread outwardly, thus releasing the holding state of carrier 3.

Thereafter, slider 21 is transferred to loading location 6 by motor 18. Therefore, after the carrier is inserted inside loading-side rotator 8 and is rotated by 90-degrees, it is possible to transfer the carrier to the inside of heating chamber 10.

Figure 7:
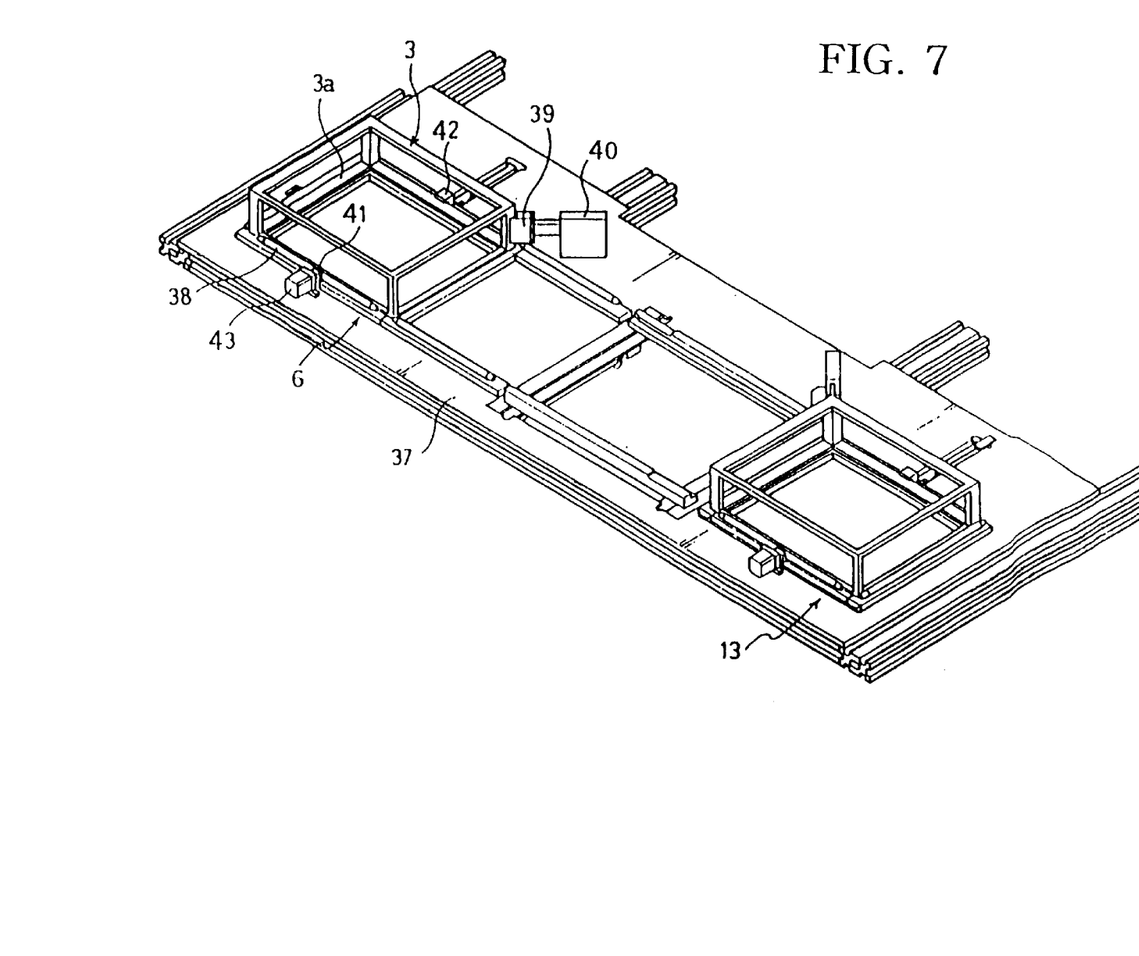
FIG. 7 is a perspective view of a carrier positioning unit as one of the main parts of the present invention.
Figure 8A:
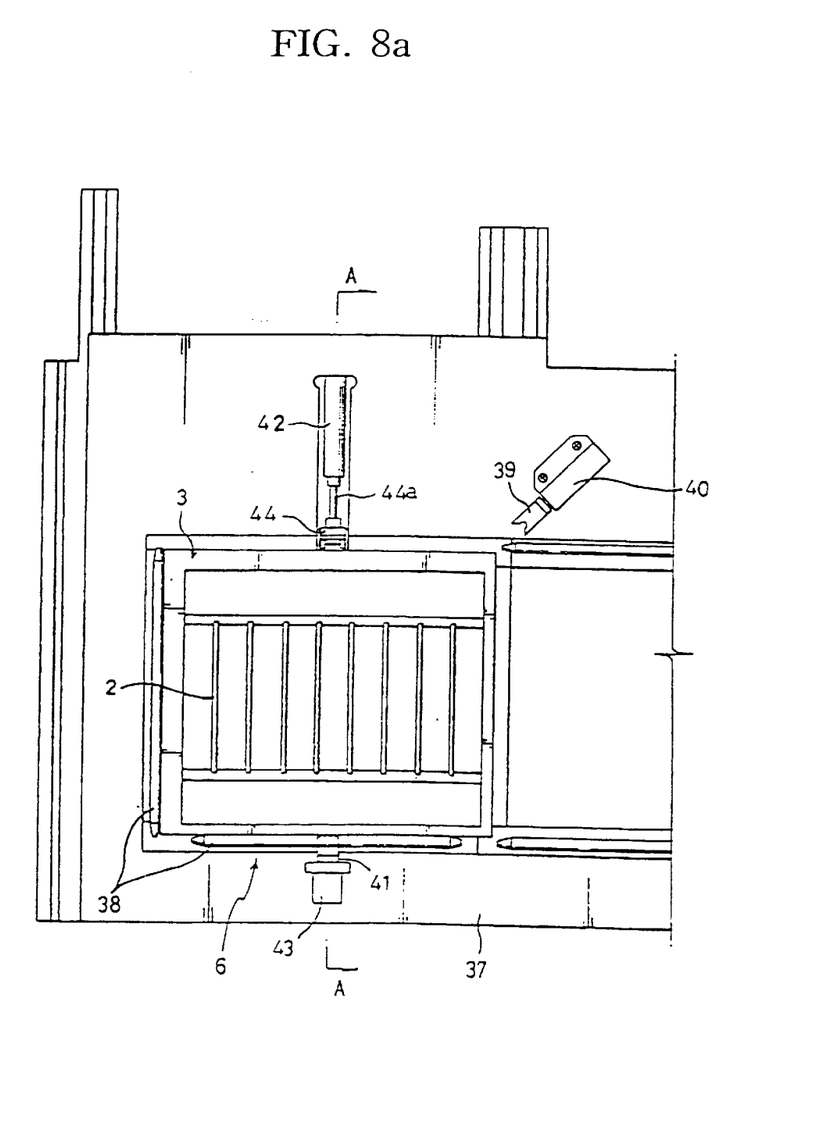
FIG. 8a shows a released holding state in which transfer of the carrier becomes possible.
Figure 8B:
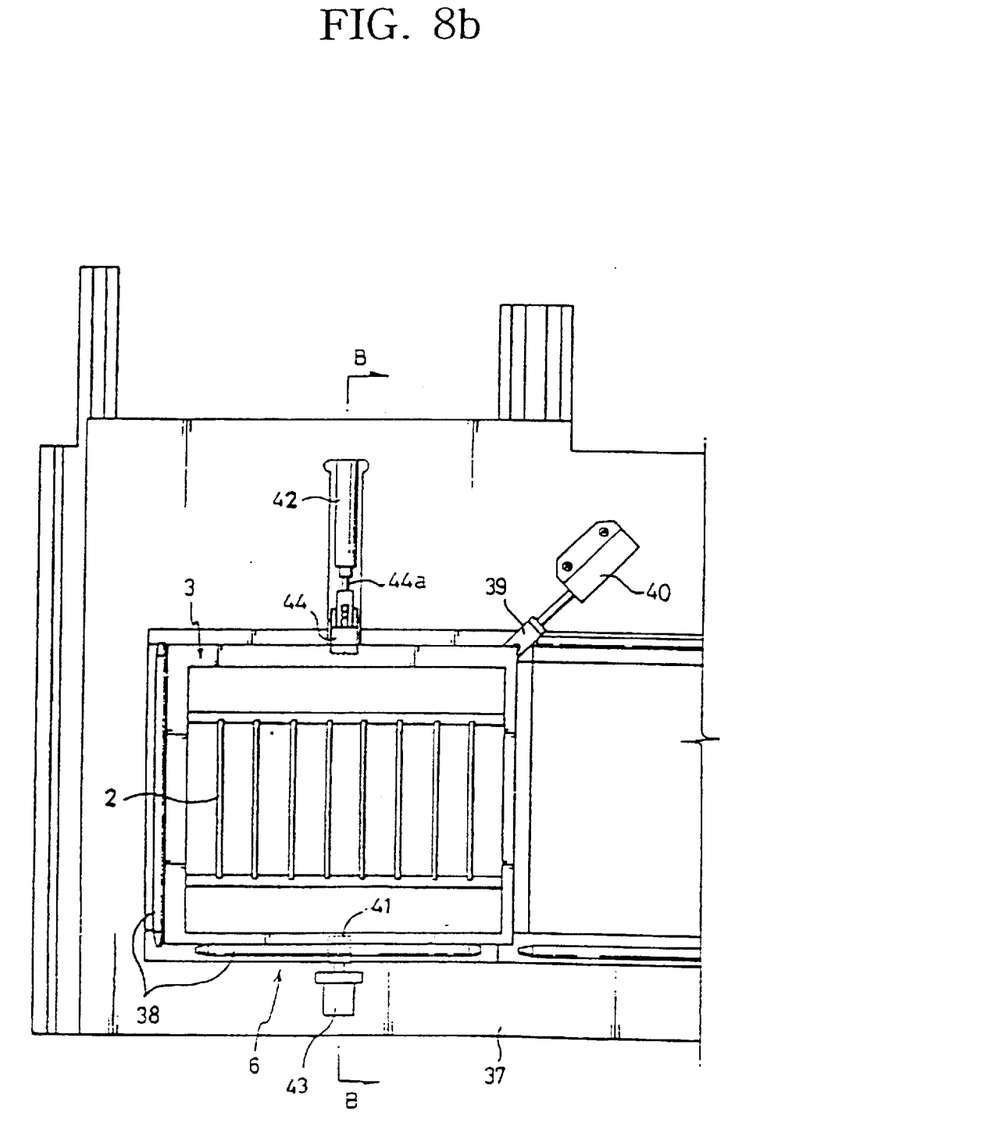
FIG. 8b shows an active holding state in which the position of the carrier is precisely defined.

FIG. 7 is a perspective view of the carrier positioning unit as one of the main parts of the present invention, and FIGS. 8a and 8b are plan views of a portion of FIG. 7.

The carrier positioned unit according to the present invention is provided with a pair of guide bars 38 for positioning adjacent side surfaces of carrier 3 on an installation plate 37 in loading and unloading locations 6, 13, respectively, and for functioning as reference surfaces in positioning carrier 3. In a diagonal direction relative to guide bars 38, there is provided a retractable pusher 39 that is operable to cause a corner portion of carrier 3 to be closely engaged to guide bars 38 when pusher 39 is driven by, for example, a cylinder or other driving means 40.

Further, in a location where rectangular carrier 3 is positioned, there is provided a pair of opposing guiders 41, 42 disposed on installation plate 37, the guider 41, 42 supporting opposing side surfaces of carrier 3 in a precise position when a corner portion of carrier 3 is pushed toward guide bars 38.

Figure 9A:
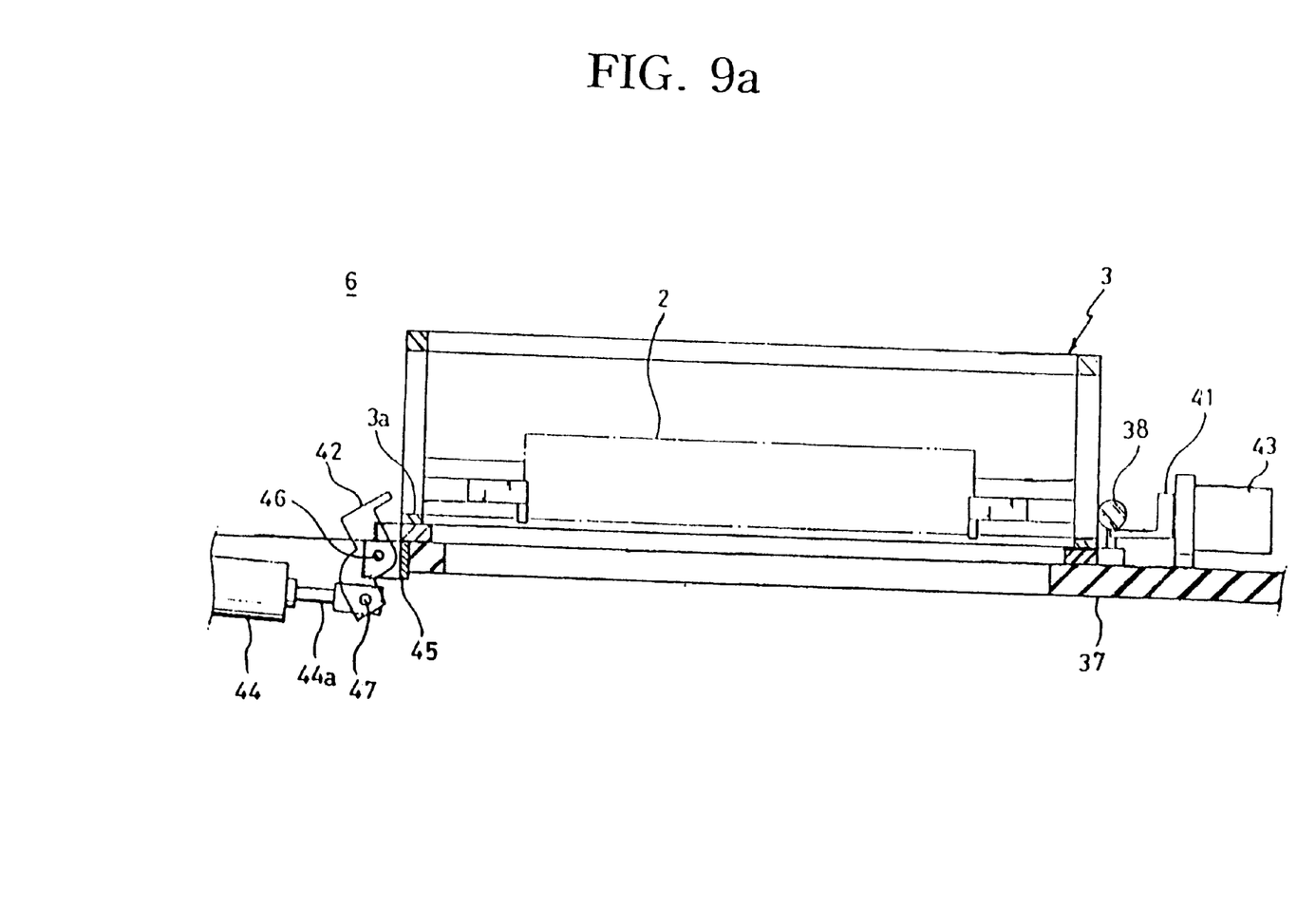
Figure 9B:
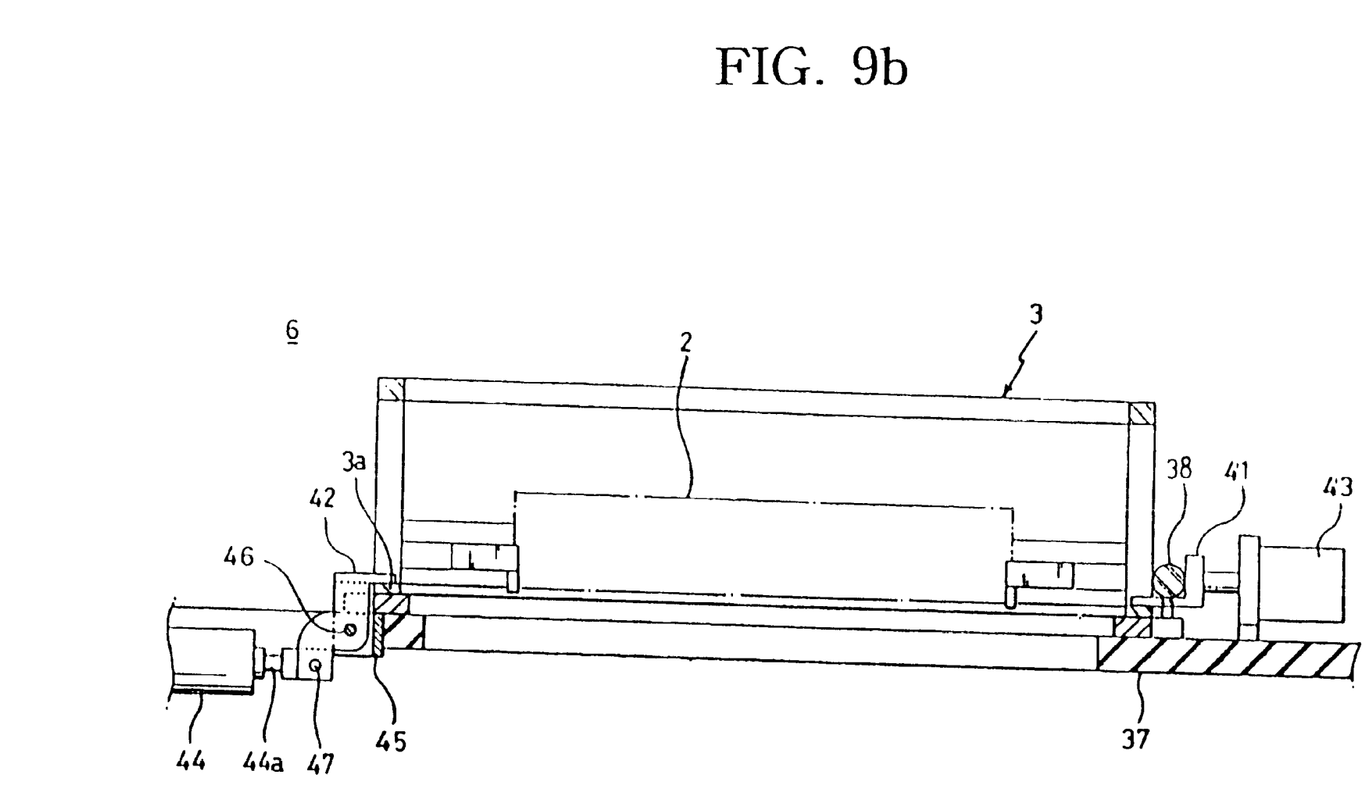
FIG. 9b is a section view taken along line B—B in FIG. 8b.

Guider 41 is, as shown in FIGS. 9a and 9b, installed to be retractable by operation of a driving means 43. Guider 42 is installed to be retractable by driving means 44.

The reason to pivot guider 42 below installation plate 37 is that it is installed within one of the traveling directions of carrier 3; that is, guider 42 pivots to be positioned below installation plate 37 so as not to interfere with movement of carrier 3. For this, guider 42 is pivotally coupled to bracket 45 with respect to axis 46, bracket 45 being located below installation plate 37. A lower end of guider 42 is coupled to rod 44a of driving means 44 with respect to axis 47.

The manner for positioning carrier 3 in loading location 6 is comparable to that in unloading location 13; therefore, the following description only relates to positioning of carrier 3 after it has been moved to loading location 6.

Before an empty carrier 3 located in unloading location 13 is transferred to loading location 6 by third transferring means 16, guider 41 is in a retracted stated due to operation of driving means 43, whereas opposing guider 42 is located below installation plate 37 as a result of pivotal movement by driving means 44.

In such a state, after empty carrier 3 has been moved to loading location 6 by third transferring means 16, carrier 3 is connected to guide bars 38.

Thereafter, when respective driving means 43, 44 drive guides 41, 42, respectively, guider 41 advances, as shown in FIGS. 8b and 9b, to be positioned on a top surface of housing 3a that forms carrier 3, whereas guider 42 pivots on axis 46 and is visible on an upper side of installation plate 37. As a result, the carrier 3 is held at loading location 6.

With carrier 3 being supported by guiders 41, 42 to hold carrier 3 at loading location 6, pusher 39 contacts a corner portion of carrier 3 and advances by operation of driving means 40 so that adjacent side surfaces of carrier 3 are brought into contact with guide bars 38. By such an operation, precise positioning of carrier 3 is effected.

Since guiders 41, 42 are positioned on an upper side of housing 3a, the position of carrier 3, once pusher 39 is activated, is precisely defined at loading location 6. Accordingly, it is possible to grasp and hold IC modules 2 contained in tray 4 using loading side pick-up means 7, and to accurately load same into carrier 3.

Next, after completion of loading of IC modules to be tested into carrier 3, positioned at loading location 6, pusher 39 and the pair of guiders 41, 42 are returned to the respective retracted states, shown in FIGS. 8a and 9a so as to enable movement of carrier 3 to loading side rotator 8 by operation of first transferring means 9. Since the returning procedures of pusher 39 and guiders 41, 42 are the reverse of the foregoing, description of the reverse procedures will be omitted.

As described above, the slider is installed to be moveable along the traveling path of the carrier, and is provided with a pair of fingers that are withdrawn or spread by one cylinder, which permits minimization of the area required to install the carrier transferring apparatus.

Further, according to the present invention, since the carrier is precisely positioned before the pick-up means loads and unloads IC modules in the loading and unloading locations, any troubles which may be caused due to position inaccuracies in the loading and unloading of the IC modules can be prevented in advance, thereby maximizing the operation rate of the apparatus. Moreover, the fact that encompassed movement of the present invention the carrier to a location of high temperature heating within the heating chamber enables thermal resistance testing for IC modules.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An IC module test handler configured to test IC modules held in a carrier, comprising:

a carrier transferring unit configured to transfer an IC module carrier between an unloading position and a loading position; and at least one positioning unit configured to position an IC module carrier at one of the unloading and loading positions, wherein the positioning unit includes:

at least one stationary guide bar, and a moving unit configured to move an IC module carrier into engagement with the at least one guide bar to position the IC module carrier in one of the unloading and loading positions.

2. The IC module test handler of claim 1, wherein the at least one guide bar comprises two guide bars that are mounted on the test handler such that when an IC module carrier is moved into engagement with the two guide bars, the IC module carrier comes to rest at one of the unloading and loading positions.

3. The IC module test handler of claim 2, wherein the two guide bars are mounted on the test handler such that when an IC module carrier is moved into engagement with the guide bars, the guide bars abut adjacent side surfaces of the IC module carrier.

4. The IC module test handler of claim 3, wherein the two guide bars are mounted on the test handler such that longitudinal axes of the guide bars are substantially perpendicular to one another.

5. The IC module test handler of claim 3, wherein the carrier transferring unit comprises:

first and second pulleys, wherein the first pulley is mounted adjacent the loading position and the second pulley is mounted adjacent the unloading position;

a flexible belt mounted on the first and second pulleys;

a motor configured to cause the belt to rotate on the pulleys; and a grasping device mounted on the belt and configured to grasp an IC module carrier, wherein movement of the belt on the pulleys causes the grasping device to move from a first position adjacent the unloading position to a second position adjacent the loading unloading position.

6. The IC module test handler of claim 5, wherein the grasping device includes:
- a first pivotable finger configured to engage a portion of an IC module carrier;
- a second pivotable finger configured to engage a portion of an IC module carrier; and
- an actuator configured to pivot the first and second fingers between open positions and closed positions, wherein the first and second fingers are configured to grasp an IC module carrier in the closed positions and to release an IC module carrier in the open positions.

7. The IC module test handler of claim 5, wherein the carrier transferring unit further comprises a guide rail, and wherein the grasping device is configured to move along the guide rail when moving between the unloading and loading positions.

8. The IC module test handler of claim 1, further comprising a clamping mechanism configured to hold an IC module carrier in one of the unloading and loading positions while IC modules are removed from or inserted into the IC module carrier.

9. The IC module test handler of claim 8, wherein the clamping mechanism comprises:
- a pivotable clamping arm configured to engage a portion of an IC module carrier; and
- a clamping actuator configured to cause the pivotable clamping arm to pivot between an unlocked position and a locked position, and wherein the pivotable clamping arm engages a portion of an IC module carrier in the locked position to hold the IC module carrier in one of the loading and unloading positions.

10. The IC module test handler of claim 9, wherein the pivotable clamping arm is configured such that when the pivotable clamping arm is located in the unlocked position, the pivotable clamping arm does not block a travel path of the IC module carrier.

11. The IC module test handler of claim 9, wherein the clamping mechanism further comprises:
- a sliding clamping arm configured to engage a portion of an IC module carrier; and
- a driver configured to drive the sliding clamping arm between an unlocked position and a locked position, and wherein the sliding clamping arm engages a portion of an IC module carrier in the locked position to hold the IC module carrier in one of the loading and unloading positions.

12. The IC module test handler of claim 11, wherein the pivotable clamping arm is mounted on a first side of one of the loading and unloading positions, and wherein the sliding clamping arm is mounted on a second side of one of the loading and unloading positions.

13. The IC module test handler of claim 8, wherein the clamping mechanism further comprises:
- a sliding clamping arm configured to engage a portion of an IC module carrier; and
- a driver configured to drive the sliding clamping arm between an unlocked position and a locked position, and wherein the sliding clamping arm engages a portion of an IC module carrier in the locked position to hold the IC module carrier in one of the loading and unloading positions.

14. The IC module test handler of claim 1, wherein the moving unit comprises a piston and cylinder mounted on the test handler and configured to engage an IC module carrier and to push the IC module carrier into engagement with the at least one guide bar.

\* \* \* \* \*